United States Patent [19]
Abate et al.

[11] Patent Number: 5,656,399
[45] Date of Patent: Aug. 12, 1997

[54] PROCESS FOR MAKING AN X-RAY MASK

[75] Inventors: Joseph A. Abate, Lafayette; George K. Celler; Jerry Vhi-Yi Guo, both of New Providence, all of N.J.

[73] Assignee: Lucent Technologies Inc., Murray Hill, N.J.

[21] Appl. No.: 589,229

[22] Filed: Jan. 22, 1996

[51] Int. Cl.$^6$ ........................................ G03F 9/00
[52] U.S. Cl. ................... 430/5; 430/22; 430/296; 378/34; 378/35
[58] Field of Search .................. 430/5, 22, 296, 430/311; 378/34, 35; 364/468

[56] References Cited

U.S. PATENT DOCUMENTS

| | | | |
|---|---|---|---|
| 4,895,780 | 1/1990 | Nissan-Cohen et al. | 430/5 |
| 5,283,746 | 2/1994 | Cummings et al. | 364/468 |

OTHER PUBLICATIONS

Cummings, K.D., J. Appl. Phys., vol. 65, p. 2024 (Mar., 1989).
Cummings, K.D., et al., Appy Physics Lett., vol. 57, p. 1431 (Oct., 1990).

*Primary Examiner*—S. Rosasco

[57] ABSTRACT

A method of making an x-ray mask intended to expose photoresist upon a layer which is to be etched to a nominal dimension, whereby effects such as global divergence, local divergence, and dose non-uniformity are compensated by adjusting the feature dimension in the mask. The compensation is achieved by varying the dose provided by an electron beam which is used to define the feature upon the x-ray mask or by adding or subtracting pixels during writing of the pattern with an electron beam. The dose is varied by changing the electron beam current or the rate at which the electron beam scans the field. The features are typically those encountered in the processing of a semiconductor wafer wherein the smallest dimension is 250 nm or less.

33 Claims, 5 Drawing Sheets

PROCESS FOR MAKING AN X-RAY MASK

BACKGROUND OF THE INVENTION

1. Field of the Invention

This invention relates to a method of ensuring reproducible critical dimensions of features on microcircuits by compensating for irregularities in the process of printing from a mask with an x-ray source, and in particular for features whose critical dimension is less than 250 nanometers.

2. Description of Related Art

The progression in computing power in microcircuits has been characterized by the quadrupling of the density of elements on the chip with each new generation of chip. The progression has been quite predictable, and people in the industry are accustomed to seeing semi-logarithmic plots of element density versus time. Similar plots are made for the dimension of the smallest feature in these circuits which is the gate electrode of a metal-oxide-silicon chip. The critical dimension determines the design rule, or generation of a new chip. For example, a 0.5 micron design rule is typical of a 16 MB DRAM, a 0.35 micron design rule typifies a 64 MB DRAM, a 0.25 micron design rule typifies a 256 MB DRAM, and so on. The critical dimension of each generation decreases by a factor of about 1.4 to quadruple the memory.

Lithographic methods have improved to provide expanded computing power, moving from visible light, to ultraviolet light, to x-ray energy sources which expose the photoresist which will define the gate electrode. All this was done to keep the wavelength exposing the resist less than the critical dimension in the generation. This effort is made to avoid diffraction effects which would unfaithfully reproduce the dimension of a feature in the mask upon the photoresist on the chip.

The error budget for faithfully reproducing critical dimension across a 3 cm by 3 cm field becomes unacceptably large for features which are 0.25 micron or less in width. Several effects contribute to the variability of etched features. The severest effect is global divergence, which is caused by the divergence of energy from the source of rays which is not collimated. The feature directly below the source is faithfully reproduced upon the resist covering the layer to be etched, but a feature at the edge of the field, where the exposing rays are not perpendicular to the mask, is reproduced with a trapezoidal cross section in near-contact printing operation. The gate electrode is typically etched in a reactive ion etching chamber in which a bias applied to the wafer causes ions to impinge normally upon the resist cross-section. The vertical projection of the trapezoidal cross section upon the gate electrode material is larger than that at the center of the exposure field. This effect can cause a 10 nanometer (nm) change for a 250 nm design rule line. Of course, this effect could be minimized if the source to mask distance was increased, or if the exposure field was reduced. But the intensity of the radiation decreases as the square of the distance to the mask, so throughput would be substantially lowered. Reducing the exposure field would constrain the layout of the chip.

Another factor in the error budget is local divergence, which is caused by the finite dimension of the x-ray source. This causes a penumbra to be cast upon the resist below the mask feature, and unfortunately, this penumbra may vary across the exposure field, if a collimating optic is used. The effect can contribute a plus or minus 4 nm variation to a 250 nm line.

A final factor is dose non-uniformity. Areas of the photoresist which are not directly under the source receive less energy per unit area than an area which is closest to the source and which receives perpendicular rays. This factor can also contribute a plus or minus 4 nm error to a 250 nm line.

Accordingly, there is an increased need in the art to control these dimensions in 250 nm design rule features and in the next generation for 180 nm features across a reasonably sized field with a source to mask distance which will provide a reasonable throughput in the wafer fabrication process. It would be desirable to compensate for these effects in making the x-ray mask so that the features which are ultimately etched on the chip are correctly sized and uniformly distributed. It would also be desirable to avoid the use of collimating x-ray optics which are not very efficient and which are difficult to make.

SUMMARY OF THE INVENTION

The present invention relates to a method of mask fabrication in which a nominal dimension of a mask feature within the field of an x-ray mask is adjusted to compensate for the variation of mask features with respect to etched features formed in a semiconductor chip using the mask. The coordinates of the mask feature relative to a coordinate system having an origin are determined. An increment for compensating the nominal dimension is computed, where the increment is a function of the position of the mask feature in a predetermined two-dimensional coordinate system or grid. The dimension of the mask feature is then adjusted by the increment. The method applies where the function describes the variation due to global divergence in the dimension of an etched feature which is formed in a semiconductor chip by using a resist which was exposed by the x-ray mask.

In another embodiment of the invention the function describes the variation due to local divergence in the dimension of an etched feature which is formed in a semiconductor chip by using a resist which was exposed by the x-ray mask.

In yet another embodiment of the invention the function describes the variation due to dose non-uniformity in the dimension of an etched feature which is formed in a semiconductor chip by using a resist which was exposed by the x-ray mask.

In any of the methods above the compensation may be performed by selecting the increment from a look-up table. The compensation is made by adjusting the nominal dimension of the mask feature. This can be done in a number of different ways such as, for example, by adding or subtracting pixels during writing of the pattern by an electron beam or by varying the dose provided by an electron beam which is used to define the feature. The dose may be varied by changing the current of the electron beam or by changing the rate at which the electron beam scans the field of the x-ray mask.

In still another embodiment of the invention a nominal dimension of a mask feature within the field of an x-ray mask is compensated by determining the coordinates of the mask feature relative to a coordinate system and determining the distance between the mask feature and the center of the field. A first increment is computed to compensate for global divergence of an etched feature on a wafer using the position of the mask feature in the predetermined two-dimensional grid. Next, a second increment is computed for compensating the dimension for local divergence of an etched feature on a wafer using position of the mask feature in the predetermined two-dimensional grid. Finally, a third increment is computed to compensate for non-uniform exposure across the printed field on a wafer using the position of the mask feature in the pre-determined two-dimensional grid. The algebraic sum of the aforementioned increments is obtained to compensate the nominal dimension of the mask feature on the x-ray mask by adjusting its width by the algebraic sum. The computation may be performed by calculating a mathematical function or by reference to a look-up table. The mask is made by varying the dose provided by an electron beam, scanning in a raster fashion, to expose resist upon an x-ray absorber in accordance with adjustments in the nominal dimension. The dose may be varied by changing the current of the electron beam or by changing the rate at which the electron beam scans the field of the x-ray mask.

A further embodiment of the invention comprises an x-ray mask having a mask feature whose nominal dimension is adjusted in accordance with any of the processes above.

These and other features and advantages of the invention will be better understood with consideration of the following detailed description of the preferred embodiments taken in conjunction with the accompanying drawings.

The drawings are not to scale.

DETAILED DESCRIPTION OF THE PREFERRED EMBODIMENTS

The effects of global divergence, local divergence, and dose non-uniformity will now be discussed in order, together with methods to compensate for their effects in making an x-ray mask so that the etched feature is precise and uniform over the exposure field.

Figure 1:
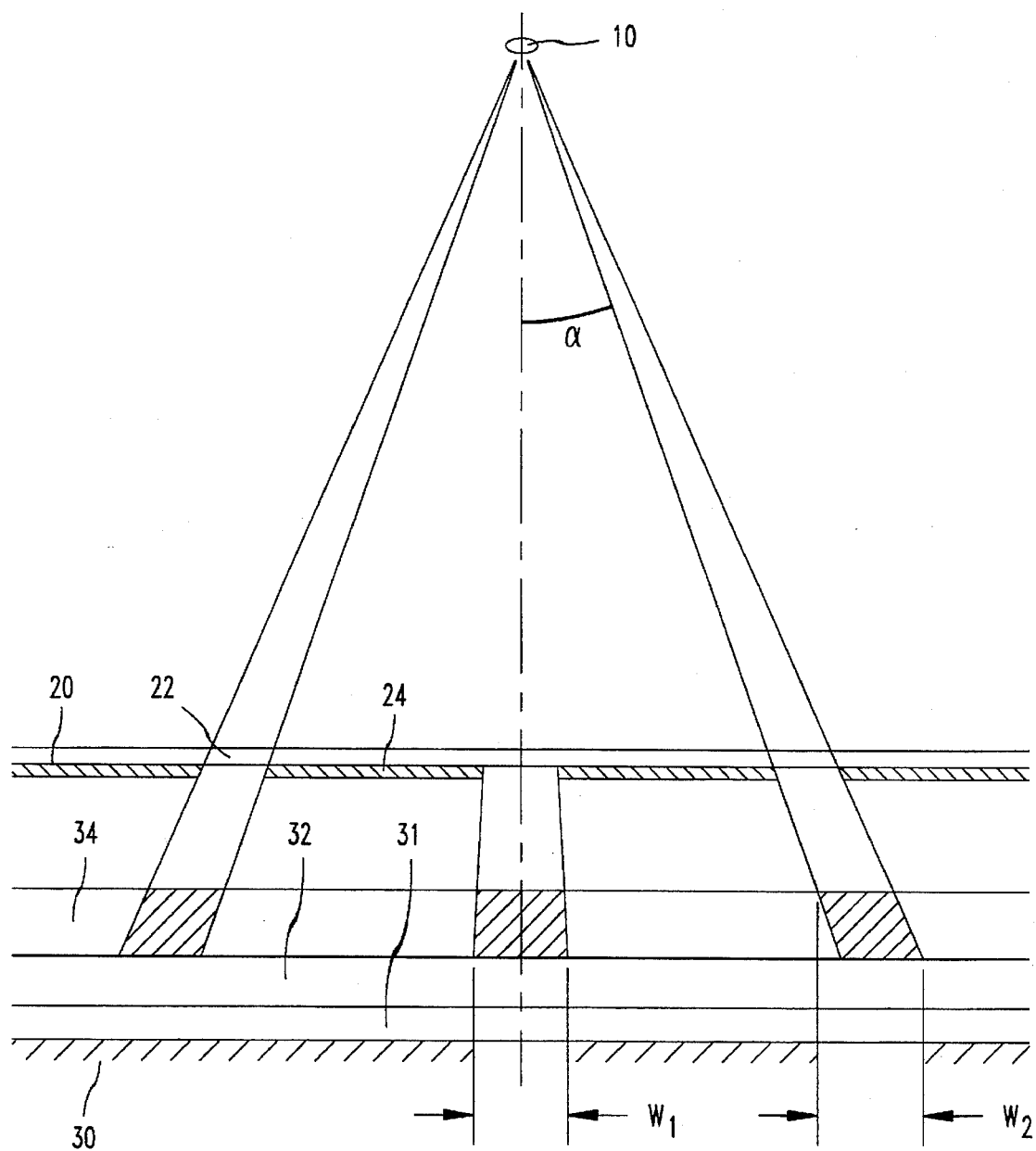
FIG. 1 is a diagram showing x-rays emanating from a point source and their relationship to an x-ray mask and a layer of photoresist which is being exposed through the mask.

Referring now to FIG. 1, there is shown a typical arrangement of an x-ray source 10 and its relation to an x-ray mask 20 which is comprised of a substrate 22 which supports an absorber 24. The mask is in close proximity to semiconductor wafer 30 which contains various layers of conductors, insulators, and ion-implanted active regions. For example, gate oxide 31 supports the uppermost layer of the wafer, conductor layer 32, which supports photoresist layer 34 which is to be exposed by the x-ray source and developed to protect that portion of the conductor layer which is to become the gate electrode. This is typically the smallest feature in the layout of the chip, its width is called the critical dimension, or design rule. A reduction in the design rule by a factor of about 1.4, quadruples the density of memory elements on a chip. The problems in creating very dense chips with 250 nm or 180 nm design rules are: (1) achieving the correct line width, (2) uniformly maintaining that line width across the width of the exposure field, and (3) maintaining registration of one layer of these features to the remainder of the layout. For example, in (3) above, the gate electrode must be centered within the gate oxide area.

Source 10 is typically 30 cm from the substrate 22 of the mask for 0.25 micron lithography and the substrate is typically silicon, silicon carbide, or silicon nitride, about one micron thick. Absorber 24 is a thin film of gold, tungsten, tungsten nitride, or some other refractory metal compound, typically 0.2 to 0.7 microns thick, or any material which prevents x-rays emanating from source 10 from exposing areas of photoresist 34 which are separated from the absorber by gap 40. After x-ray exposure and developing to remove unwanted areas of the resist, the resist profile directly beneath the source is approximately rectangular, while features 1.5 cm away from the center of the field are shaped like a trapezoid. When the wafer with its protective resist pattern is placed in a reactive ion etcher, ions impinge upon the combination in a nearly collimated manner under the influence of a bias upon the wafer. The vertical projection of the resist cross-section upon the conductor layer 32 at the base of the feature, W1, is different from the projection W2 at the edge of the field. This variation is due to global divergence, which is a function of position in the exposure field, and it is caused by non-collimated x-rays. The degree of non-collimation is indeed very small, the included half-angle $\alpha$ between a ray extending 1.5 cm from the center of the exposure field and a ray to the center of the mask being only 50 milliradians (2.86 degrees). This is nevertheless sufficient to cause a 10 nm variation in a critical dimension of 250 nm across the exposure field.

Figure 2:
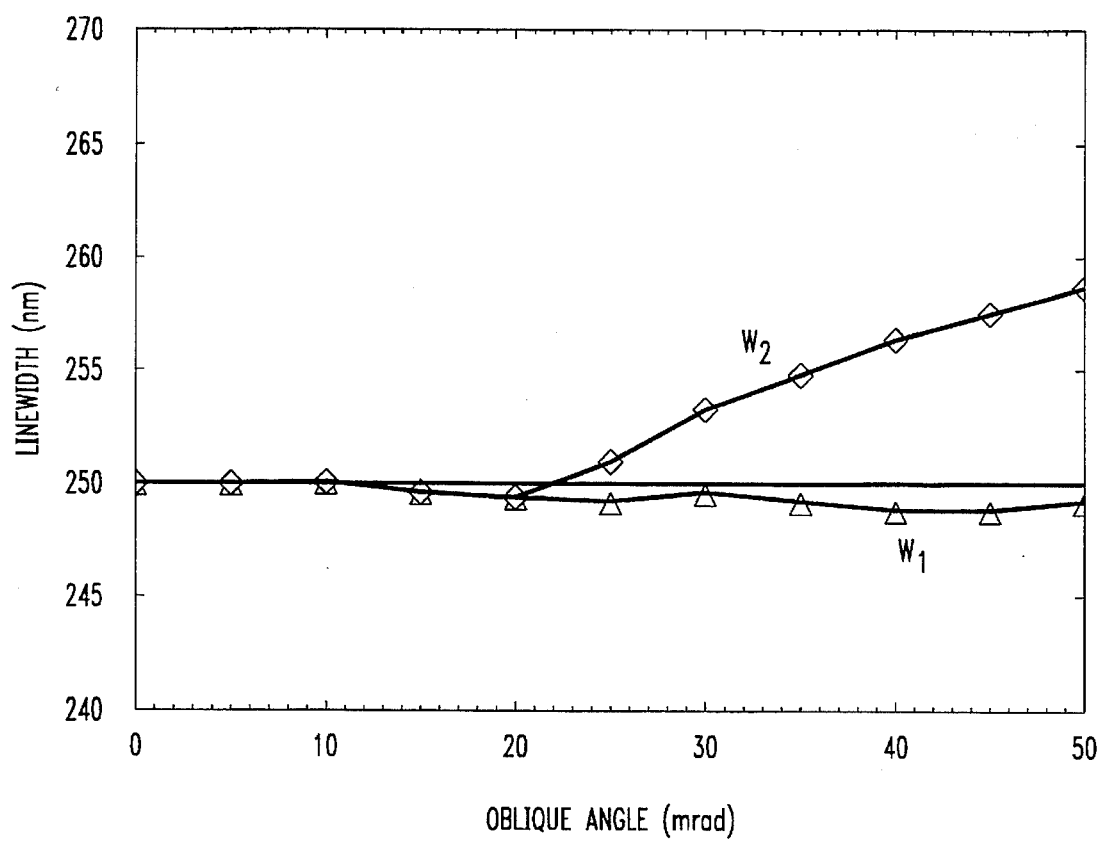
FIG. 2 is a graph showing the variation in linewidth of a feature due to global divergence.

Referring now to FIG. 2, there is shown a plot of the linewidth of an etched feature as a function of the angle $\alpha$ the incident radiation makes away from the normal to the mask. Global divergence is a large contributor to the variation in a critical dimension over the field of exposure. The data apply for a 25 micron gap between the mask and the wafer, a 0.3 micron absorber thickness, and a 0.5 micron resist protecting the wafer.

Figure 3:
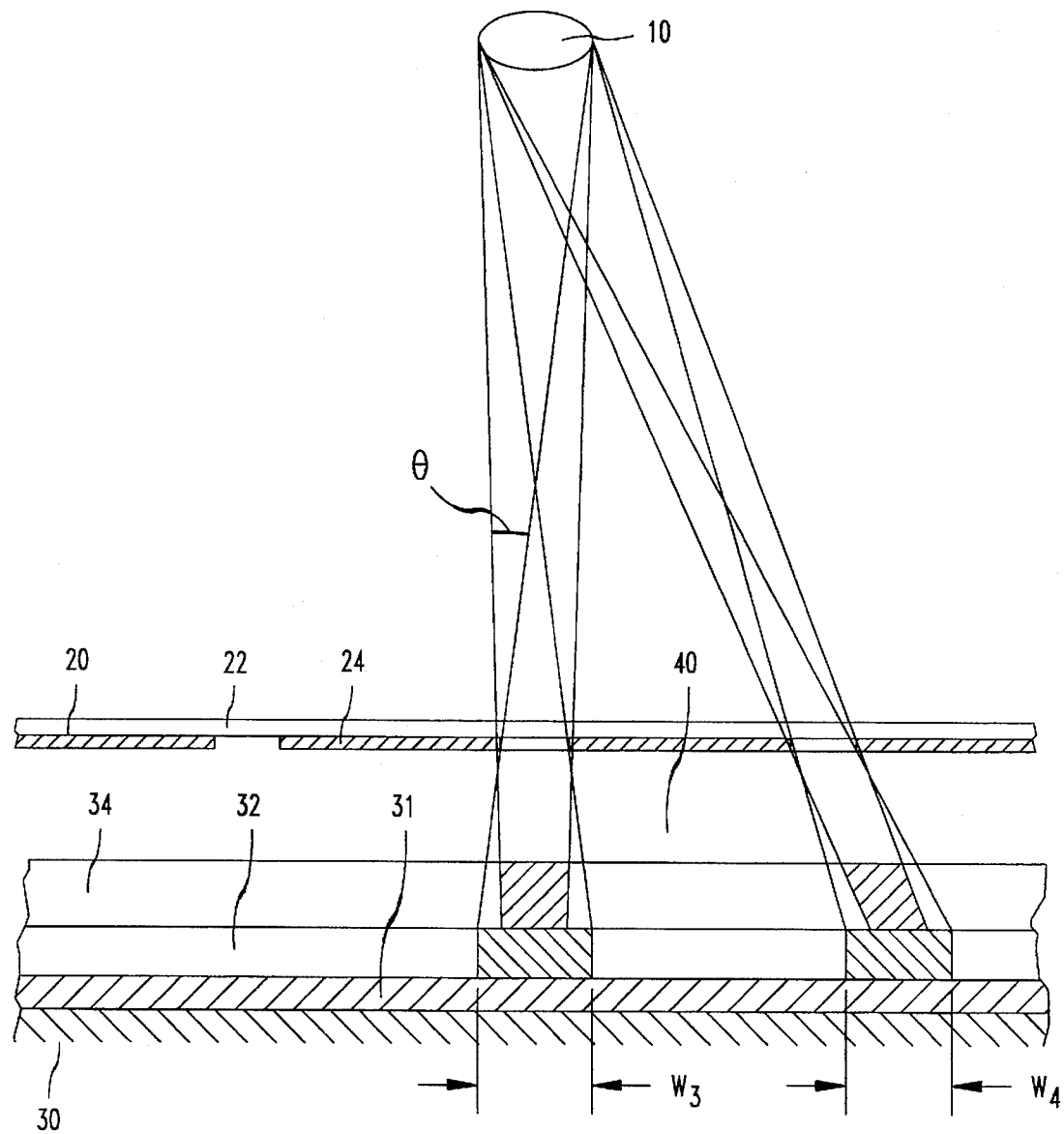
FIG. 3 is a diagram showing the relationship of x-rays emanating from a finite source and their intersection with a layer of photoresist beneath an x-ray mask.

Referring now to FIG. 3, local divergence is caused by the finite size of the source. A typical x-ray source is a plasma whose diameter is about 200 microns. Even at a distance of 30 cm from the mask, the projected shadow of a feature in the mask creates a penumbra which causes the image to be blurred. In processing, this is actually an advantage because it provides some degree of process latitude, however, local divergence may not be uniform across the exposure field, so it contributes to the error budget in achieving the critical dimension in a design. An exaggerated source 10 is shown above mask features 24 which are separated from the resist layer 34 by a gap 40. The penumbra cast upon the resist by two equally sized features on the mask at the center of the field and at its edge, W3 and W4, respectively, are dissimilar in size. The other numbered elements in FIG. 3 are the same as the numbered elements in FIG. 1.

Figure 4:
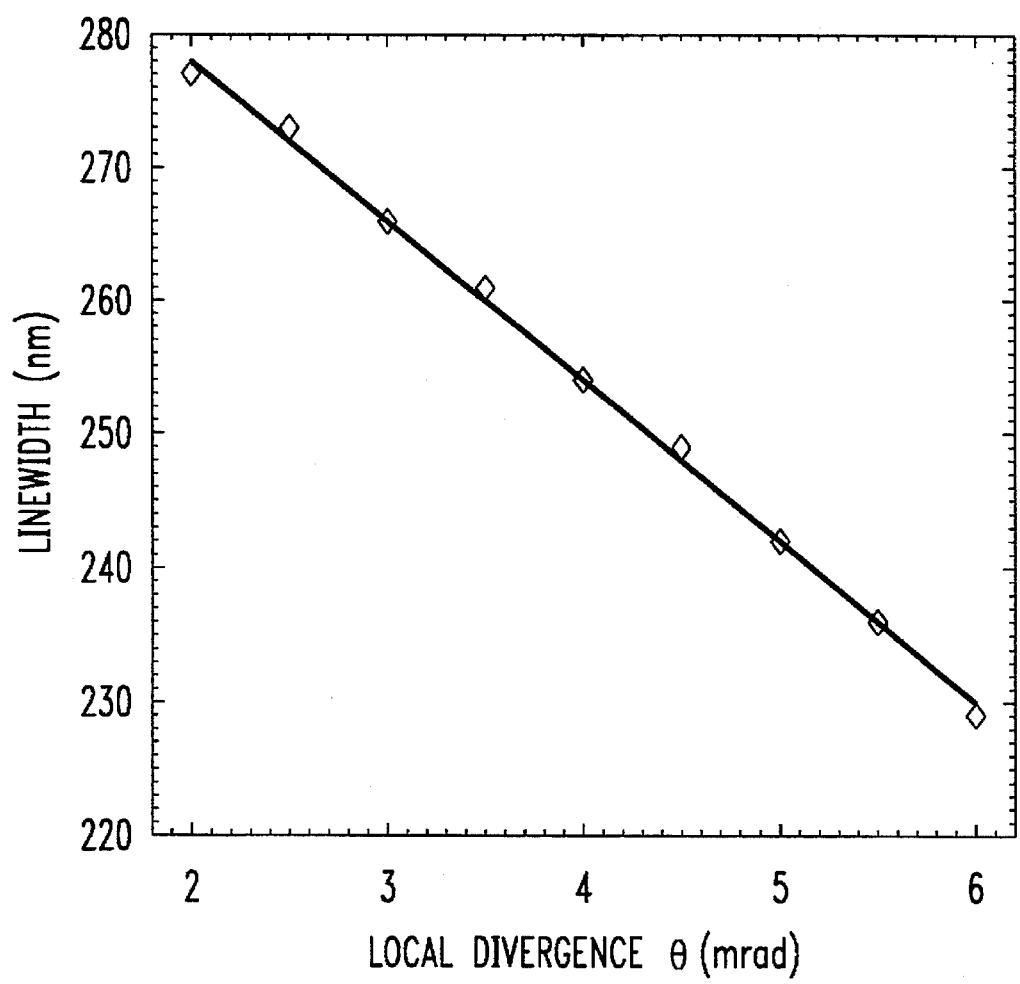
FIG. 4 is a graph showing the variation in linewidth of a feature due to local divergence of the feature in FIG. 2.

Referring now to FIG. 4, there is shown the variation in etched linewidth from a nominal 250 nm mask feature as a function of the angle $\theta$ which is the included angle made by the penumbra in FIG. 3. The angle $\theta$ varies across the exposure field of the mask, so it is related to the angle $\alpha$ which a ray makes with the normal to the mask, and the linewidth variation shown in FIG. 4 may be expressed as a function of either angle. A plus or minus four milliradian change in this angle can cause a plus or minus four nm change in the linewidth.

A variation in linewidth due to dose non-uniformity results where a resist has a finite contrast ratio rather a step function. The slope of this curve for optical density versus exposure is well known as Gamma for photographic film, and x-ray resist behaves in a similar way. Higher contrast resists have higher Gamma values.

Assuming that the source has a constant intensity, the intensity for each incremental area of photoresist 34 in FIG. 1 is not constant because the photoresist is planar as it intercepts the exposing rays, rather than spherical surrounding the source. Any incremental area which is not at the center of the field will therefore receive a smaller dose than the increment at the center.

Figure 5:
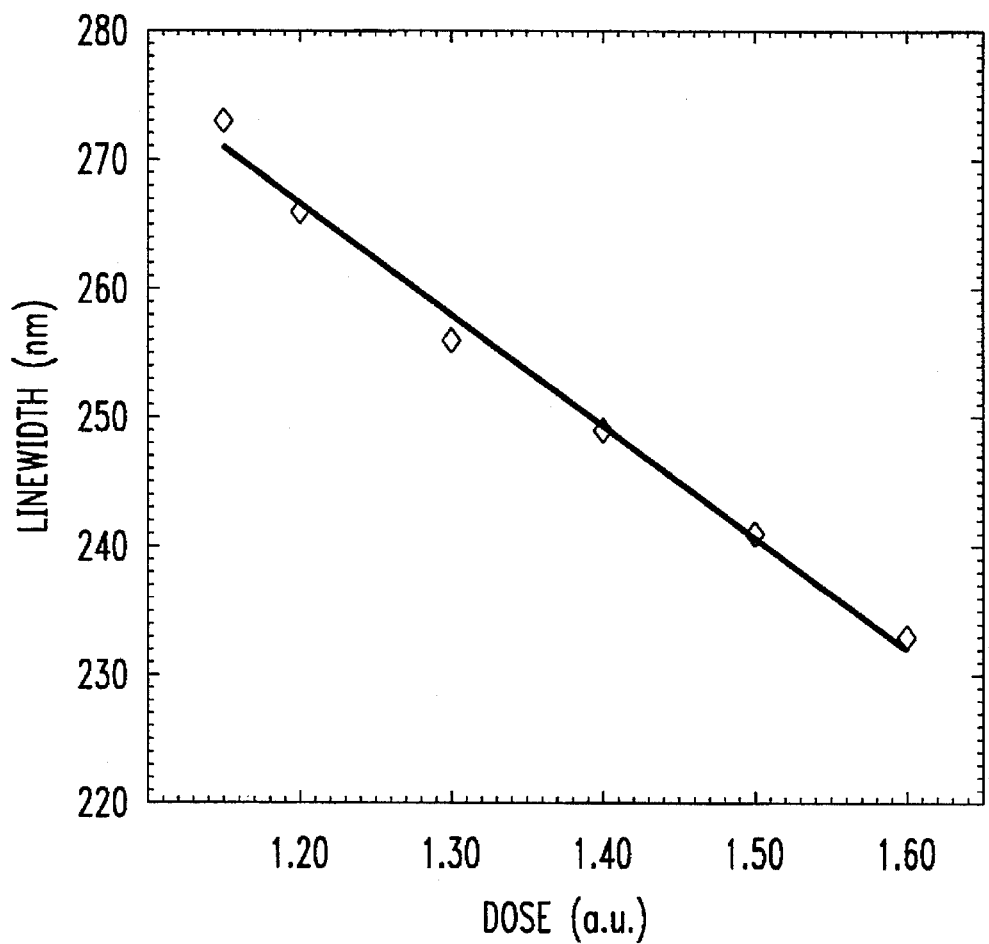
FIG. 5 is a graph showing the variation in linewidth of a feature due to dose non-uniformity of the feature in FIG. 2.

Referring now to FIG. 5, there is shown the linewidth of an etched feature as the dose, in arbitrary units, varies for a 250 nm mask feature. In operation, it is possible to maintain the dose uniformity within 3%, resulting in a plus or minus four nm error in etched linewidth.

The effects described above contribute to errors in feature dimensions which potentially exceed the tolerances for 250 nm design rules. In the process of the present invention, mask features are formed with dimensions that compensate for these errors. During the mask fabrication process, the dimensions of the mask features are tailored so that features with the desired dimension will be obtained when the mask is used in a process for device fabrication. The mask features are tailored by varying the dimensions of the features in the mask as a function of the position of the feature relative to the center of the exposure field.

The x-ray mask is produced by coating the absorber (gold, tungsten, etc.) with a resist which is sensitive to an electron beam. Since few x-ray masks are used to fabricate many device wafers, time can be taken to expose the electron resist by raster scanning it with stepping increments which are significantly smaller than the critical dimension which must be printed upon the semiconductor wafer. The pattern to be printed is converted into a digital array of pixels wherein the beam is programmed to be varied at each pixel.

Without compensation the critical dimensions in the electron resist pattern would be written exactly as the critical dimension required on the semiconductor. This is tolerable for making circuits with sufficiently large features where the effects of global divergence, local divergence, and dose non-uniformity contribute only a small error to the critical dimension over the exposure field. This is not tolerable for a 256 MB generation with 250 nm design rules.

It is contemplated that the size of the mask features can be adjusted in a number of different ways to compensate for deviations in the wafer feature size that are caused by global divergence, local divergence and dose nonuniformity of the x-ray beam incident on the x-ray mask. If the dimension of the correction is at least as large as a grid step (a grid step is the smallest writing increment of the e-beam), the correction is accomplished by software that uses the pattern data file as input and, based upon a lookup table or a formula that determines how many pixels to add or subtract to the mask exposure step as a function of the average distance of the feature from the center of the field in the x and y direction. For example, to compensate for global divergence in the wafer exposure step, the width of mask features with a line-and-space configuration, which are approximately perpendicular to a vector pointing way from a given line to the center of the field, is narrowed with respect to the distance of the line from the center of the field. The further the mask feature (i.e. line) is from the center of the field, the more narrow the line becomes. The width of the mask feature is adjusted either by subtracting a row of pixels from the exposure, or by reducing the dose that reaches the pixels at the edge of the exposed feature. If the adjustment is smaller than the grid size, then subtracting pixels is not an option.

How the beam is controlled to effect the desired adjustment in the mask features depends, in part, on the electron beam used to write the pattern in the resist coating on the x-ray mask substrate. If the beam is a Gaussian beam, then the exposure proceeds pixel by pixel and the feature size can be adjusted pixel by pixel as described above, provided that the adjustment is within the parameters described above. If the beam is a variable shaped beam (a beam that exposes a square or rectangular area at once, and is then advanced to a new area), then the beam shape is adjusted to control the dimensions of the feature in a manner similar to the manner used to add or subtract pixels from an exposure using a Gaussian beam, i.e., the dimensions of the desired feature on the wafer is used as input, and based upon a look up table, the dimensions of the beam are altered to provide a mask feature that can be used to form a feature with the desired dimensions on the wafer.

Another example of one way to tailor the mask feature so that the desired dimensions of the feature on the substrate are obtained is by utilizing the proximity effect correction technique to tailor the mask features to the desired dimension. The proximity effect correction technique controls the dose of radiation to the energy sensitive resist material used to define the mask features to compensate for the scattering of electrons in the energy sensitive resist material during the exposure step. Because electrons scatter into adjacent regions during the exposure, features or portions of features formed in a region with a higher density of features (and thus a higher ratio of exposed to unexposed portions) may receive a higher exposure dose than a region with a lower density of features (and thus a lower ratio of exposed to unexposed portions).

Electron scattering behavior and mechanisms for adjusting exposure dose to adjust for electron scattering behavior are disclosed in Cummings, K. D., J. Appl. Phys., Vol. 65, p. 2024 (1989) and Cummings, K. D., et al., Appl. Physics Lett., Vol. 57, p. 1431 (1990) which are hereby incorporated by reference. Typically, the data file for a given exposure pattern is processed using a proximity correction process, an example of which is described in U.S. Pat. No. 5,283,746 to Cummings et al. and which is hereby incorporated by reference. The approximate dose that will be introduced into a given pixel of the image from the electrons scattered from neighboring pixels is computed by such a process. The dose at that particular pixel is then adjusted up or down to compensate for the amount of dose attributed to scattering. In this manner a uniform dose is received at all points in the exposed region.

In the process of the present invention, the dosage is adjusted even more to change the dimensions of the resultant feature to compensate for feature size changes on the wafer that are attributable to global divergence, local divergence, and dose nonuniformity of the x-ray beam impinging on the x-ray mask. Because the proximity effect correction software adjusts the dose of the beam to correct for the proximity effect, it is easily adapted to adjust the shape of the feature to compensate for these other effects. The software is adapted by providing a data file for making the necessary adjustments to the mask feature. The output of the modified proximity effect software is a file that instructs the apparatus to expose certain pixels and the dose of radiation to provide to each pixel. Therefore, the output of the software is modified by the data file to make the desired correction in the mask feature to compensate for global divergence, local divergence, and dose uniformity. Proximity effect correction and mask feature compensation can either be done in the same procedure or in two separate procedures. The software for mask compensation would have a pattern data file and a look-up table file and, based upon these input files, an output file that controls the e-beam mask writer is generated.

For example, the method of compensating a dimension of a feature in the field of an x-ray mask involves determining the location of the mask feature relative to a coordinate system. Since, for a point source without a collimator, global divergence is minimum at the center of the field, it is simplest, but not necessary, to define the origin of the coordinate system there. The coordinate system may be rectangular or circular. Since the features of a circuit are designed in a rectangular system, this is the preferred one to use. To compensate for global divergence, the rectangular coordinates of the feature are determined relative to the origin. Since the features of interest have critical dimensions of 250 nm or less, and the field is at least 2×2 cm, the coordinates of any pixel comprising the feature may serve as the coordinates of the whole feature without loss of accuracy. These coordinates are then used for computing an increment for compensating the dimension of the feature on the x-ray mask.

For the case of global divergence, the increment is the difference in linewidth from the nominal, 250 nm in this case, as shown in FIG. 2. For the case of local divergence, the increment is the difference in linewidth from the nominal as shown in FIG. 4. For the case on non-uniform exposure, the increment is the difference in linewidth from the nominal as shown in FIG. 5. In one embodiment, the functional relationships shown in FIG. 2, FIG. 4, or FIG. 5 can be used to generate a look-up table for each (x,y) coordinate in the grid which can then be used to adjust the feature size by the desired increment.

The increments for global divergence, local divergence, and non-uniform exposure are then used to obtain an algebraic sum for compensating the nominal dimension of the feature on the x-ray mask. The nominal dimension is adjusted by the methods previously discussed. By varying the dose, corrections can be made to features which are being exposed by raster scanning even if they are smaller than the minimum grid step. The dose may be varied by changing the beam current or the rate at which the beam scans the field.

The advantages of this invention are that circuits with 250 nm, 180 nm, and smaller design rules can be produced with an x-ray mask without the use of an x-ray collimator. These collimators are not very efficient and are difficult to design. If a collimator is used together with the compensations described in the invention, the three effects described above are similar contributors to the error budget, and the collimator may be more efficient because greater collection angles are allowed. The need to rotate or wobble the collimator to provide for processing margin is also eliminated by using a mask with the compensations described.

Changes and modifications in the specifically described embodiments can be carried out without departing from the scope of the invention. In particular, the elements and structure of the x-ray mask may change as new materials are developed, and the character and dimensions of the source may change as improved sources are developed, and the geometrical relationship of the source, the x-ray mask, and the photoresist layer on the wafer may be altered from the examples given.

We claim:

1. A method of compensating a nominal dimension of a mask feature within a field of an x-ray mask comprising:
   determining the coordinates of the mask feature relative to a coordinate system having an origin;
   computing an increment for compensating the dimension, said increment being a function of the position of the mask feature in the coordinate system; and
   adjusting the nominal dimension of the mask feature by the increment.

2. The method of claim 1 wherein the function describes the variation due to global divergence in the dimension of an etched feature which is formed by using a resist which was exposed by the x-ray mask.

3. The method of claim 1 wherein the function describes the variation due to local divergence in the dimension of an etched feature which is formed by using a resist which was exposed by the x-ray mask.

4. The method of claim 1 wherein the function describes the variation due to dose non-uniformity in the dimension of an etched feature which is formed by using a resist which was exposed by the x-ray mask.

5. The method of claim 1 wherein computing the increment comprises selecting the increment from a look-up table.

6. The method of claim 5 wherein the look-up table describes the variation due to global divergence in the dimension of an etched feature which was formed by using a resist which was exposed by the x-ray mask.

7. The method of claim 5 wherein the look-up table describes the variation due to local divergence in the dimension of an etched feature which was formed by using a resist which was exposed by the x-ray mask.

8. The method of claim 5 wherein the look-up table describes the variation due to dose non-uniformity in the dimension of an etched feature which was formed by using a resist which was exposed by the x-ray mask.

9. The method of claim 1 wherein adjusting the dimension of the mask feature comprises varying a dose provided by an electron beam which is used to define the feature.

10. The method of claim 9 wherein the dose is varied by changing the current of the electron beam.

11. The method of claim 9 wherein the dose is varied by changing the rate at which the electron beam scans the field.

12. An x-ray mask having a mask feature whose nominal dimension is adjusted in accordance with the process of claim 1.

13. A method of compensating a nominal dimension of a mask feature within the field of an x-ray mask for global divergence comprising;
   determining the coordinates of the mask feature relative to a coordinate system having an origin;
   computing an increment for compensating the nominal dimension of the mask feature from a function relating the variation due to global divergence in the dimension of an etched feature on a wafer to the position of the mask feature in the coordinate system; and
   adjusting the dimension of the mask feature by the increment.

14. The method of claim 13 wherein the computation comprises selecting the increment from a look-up table which relates the variation in dimension of an etched feature to the position of the mask feature in the coordinate system.

15. The method of claim 13 wherein adjusting the dimension of the mask feature comprises varying a dose provided by an electron beam which is used to define the mask feature.

16. The method of claim 15 wherein the dose is varied by changing the current of the electron beam.

17. The method of claim 15 wherein the dose is varied by changing the rate at which the electron beam scans the field.

18. A method of compensating a nominal dimension of a mask feature within the field of an x-ray mask for local divergence comprising;
   determining the coordinates of the mask feature relative to a coordinate system having an origin;

computing an increment for compensating the nominal dimension of the mask feature from a function relating the variation due to local divergence in the dimension of an etched feature on a wafer to the position of the mask feature in the coordinate system; and adjusting the dimension of the mask feature by the increment.

19. The method of claim 18 wherein the computation comprises selecting the increment from a look-up table which relates the variation in dimension of an etched feature to the position of the mask feature in the coordinate system.

20. The method of claim 18 wherein adjusting the dimension of the mask feature comprises varying a dose provided by an electron beam which is used to define the mask feature.

21. The method of claim 18 wherein the dose is varied by changing the current of the electron beam.

22. The method of claim 18 wherein the dose is varied by changing the rate at which the electron beam scans the field.

23. A method of compensating a nominal dimension of a mask feature within the field of an x-ray mask for dose non-uniformity comprising:

determining the coordinates of the mask feature relative to a coordinate system having an origin;

computing an increment for compensating the nominal dimension of the mask feature from a function relating the variation due to dose non-uniformity in the dimension of an etched feature on a wafer to the position of the mask feature in the coordinate system; and adjusting the dimension of the mask feature by the increment.

24. The method of claim 23 wherein the computation comprises selecting the increment from a look-up table which relates the variation in dimension of an etched feature to the position of the mask feature in the coordinate system.

25. The method of claim 23 wherein adjusting the dimension of the mask feature comprises varying a dose provided by an electron beam which is used to define the mask feature.

26. The method of claim 25 wherein the dose is varied by changing the current of the electron beam.

27. The method of claim 25 wherein the dose is varied by changing the rate at which the electron beam scans the field.

28. A method of compensating a nominal dimension of a mask feature within the field of an x-ray mask comprising;

determining the coordinates of the mask feature relative to a coordinate system having an origin;

computing an first increment for compensating the nominal dimension of the mask feature from a function relating the variation of the dimension due to global divergence of an etched feature on a wafer to the position of the mask feature in the coordinate system;

computing a second increment for compensating the nominal dimension of the mask feature from a function relating the variation of the dimension due to local divergence of an etched feature on a wafer to the position of the mask feature in the coordinate system;

computing a third increment for compensating the nominal dimension of the mask feature from a function relating the variation of the dimension due to non-uniform exposure of an etched feature on a wafer to the position of the mask feature in the coordinate system;

obtaining the algebraic sum of the aforementioned increments for compensating the nominal dimension of the feature; and adjusting the dimension of the feature by the algebraic sum of the increments.

29. The method of claim 28 wherein the computation of the increments comprises selecting them from a look-up table.

30. The method of claim 29 wherein adjusting the dimension of the nominal feature comprises varying a dose provided by an electron beam which is used to define the feature.

31. The method of claim 30 wherein the dose is varied by changing the current of the electron beam.

32. The method of claim 30 wherein the dose is varied by changing the rate at which the electron beam scans the field.

33. An x-ray mask having a mask feature whose nominal dimension is adjusted in accordance with the process of claim 28.

* * * * *